United States Patent [19]

Stebbins

[11] Patent Number: 4,856,099
[45] Date of Patent: Aug. 8, 1989

[54] ULTRA FAST ANALOG TO DIGITAL CONVERTERS

[75] Inventor: Edwin E. Stebbins, New York, N.Y.

[73] Assignee: Hypres, Incorporated, Elmsford, N.Y.

[21] Appl. No.: 236,641

[22] Filed: Aug. 24, 1988

[51] Int. Cl.$^4$ ...................... H03M 1/12; H01L 39/22
[52] U.S. Cl. .................................... 341/133; 341/155
[58] Field of Search ...................... 341/133, 155, 171; 357/5

[56] References Cited

U.S. PATENT DOCUMENTS 3,949,395  4/1976  Klein .................................... 341/133
4,315,255  2/1982  Harris et al. .......................... 341/133
4,551,704  11/1985  Anderson ............................ 341/133

OTHER PUBLICATIONS

W. Anacker, "Analog-To-Digital Converter Using Josephson Tunneling Circuits", IBM TDB, vol. 17, No. 4 (Sep. 1974), pp. 1237–1237A.
F. F. Fang and D. J. Herrell, "Analog-To-Digital Converter For Josephson Tunneling Memory", IBM TDB, vol. 18, No. 8 (Jan. 1976), pp. 2668–2670.

Primary Examiner—William M. Shoop, Jr.
Assistant Examiner—Marc S. Hoff
Attorney, Agent, or Firm—Kenyon & Kenyon

[57] ABSTRACT

An ultrafast analog to digital converter is provided which uses Josephson devices. The converter has a plurality of Josephson junction interferometers. The output of each interferometer is a bit that forms part of a digital representation of a sampled analog signal. Each of the interferometers has an offset, with each offset being different. The bits output by the interferometers are weighted by the offsetting. The weighting of bits by offsetting rather than periodicity allows the use of interferometers which do not need to maintain periodicity over a great number of periods, and can therefore have lower internal inductance and better high speed properties.

10 Claims, 5 Drawing Sheets

ULTRA FAST ANALOG TO DIGITAL CONVERTERS

FIELD OF THE INVENTION

The invention relates to the field of analog to digital converters, and specifically to such converters which use Josephson junction interferometers.

BACKGROUND OF THE INVENTION

It has been proposed in the past to use Josephson devices in an analog to digital (A/D) converter. Due to their high speeds, the Josephson devices have great potential for use in an A/D converter. However, to date, the performance achieved by previous superconducting converters has been relatively poor, due to the limited state of the art in fabrication and the circuit topologies used.

In one known design of an n-bit A/D converter using Josephson devices, each of the interferometers divides a sampled input analog signal differently, in order to weight the bits output by each interferometer. This is known as weighting by periodicity. The concatenation of the weighted bits is a digital representation of the analog signal. Thus, the signal to the interferometer which produces the most significant bit will be divided by two, for example, while the signal to the interferometer producing the least significant bit is divided by a larger number, 32 for example. In general, in an n-bit A/D converter, the signal to the interferometer producing the least significant bit needs to be divided into $2^{n-1}$ identical periods. Interferometers capable of a relatively large number of identical periods will have high internal inductance, with slow speed and threshold shifts due to input slew rate. There is therefore a problem in using interferometers which are weighted by periodicity in an A/D converter.

SUMMARY OF THE INVENTION

The above-identified problems are solved in the present invention by the provision of weighting the interferometers by offsetting, rather than periodicity. An analog to digital converter constructed in accordance with the present invention comprises a plurality of interferometers, the output of each interferometer being a bit that is part of a digital representation of a sampled analog signal. Each interferometer has an offset that is different from the offsets of the rest of the interferometers. The bits output by the interferometers are weighted by the offsets of the interferometers.

The weighting by offsetting instead of periodicity allows larger-bit converters which use interferometers that need to maintain periodicity over a smaller amount of periods than in the prior art. Therefore, the interferometers have lower internal inductance and better high-speed properties.

DETAILED DESCRIPTION

Figures 1, 1A:
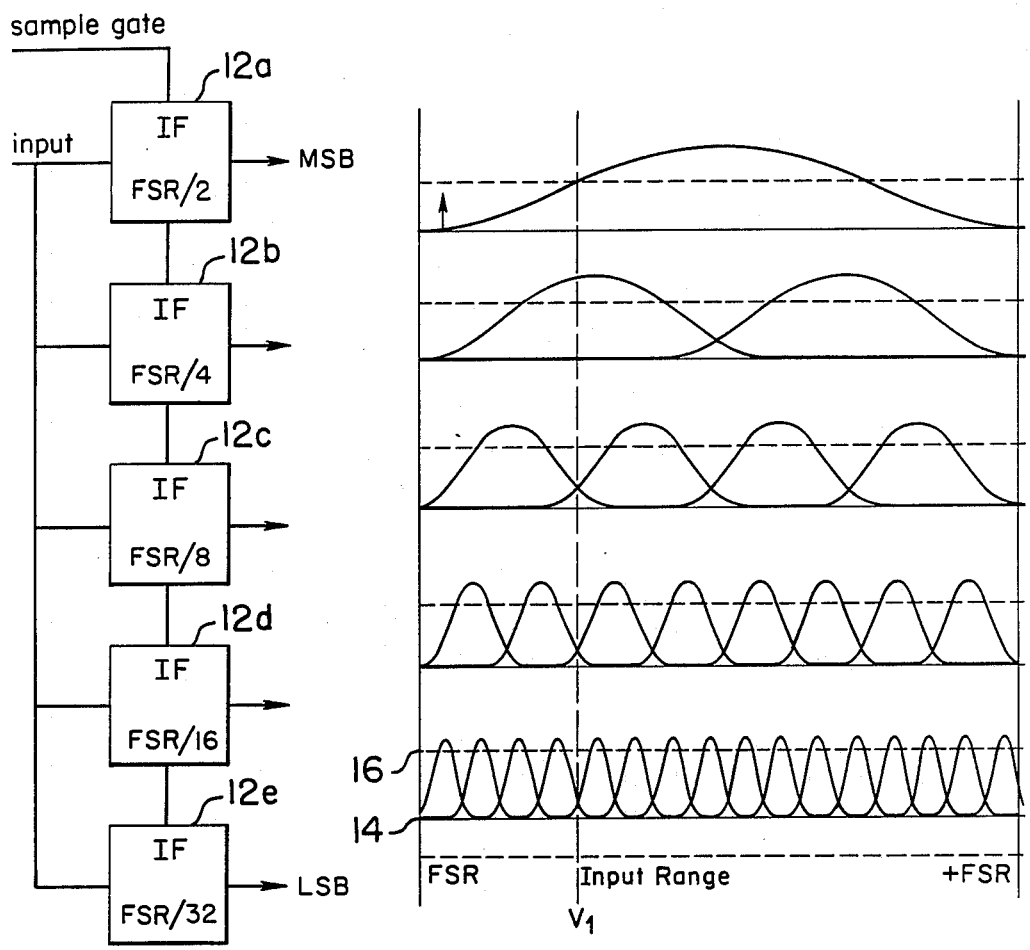
FIG. 1 shows a block diagram of a prior art analog to digital converter.
FIG. 1a illustrates the transfer curves for the prior art converter of FIG. 1 over a signal input range.

FIG. 1 shows a prior art arrangement for an analog to digital converter 10, comprising five Josephson junction interferometers 12a–e. Interferometers are used as comparators because of their periodic threshold characteristics. Josephson junction interferometers themselves are known.

Each of the five interferometers 12a–e divide the input frequency in order to weight the output bits. The first interferometer divides the input frequency by two, the second interferometer divides the frequency by four, etc., until the fifth interferometer divides the frequency by thirty-two.

Figure 2:
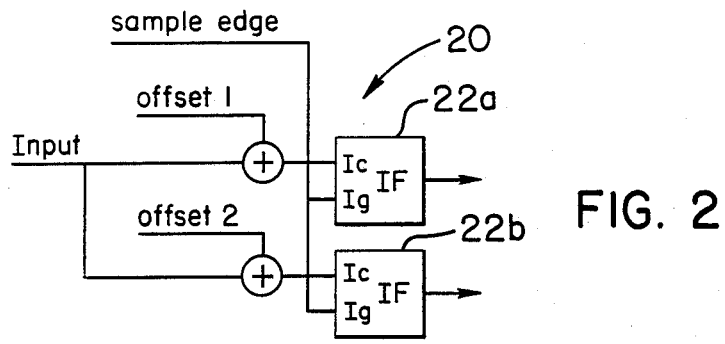
FIG. 2 is a block diagram of a two-bit analog to digital converter constructed in accordance with an embodiment of the present invention.
Figure 2A:
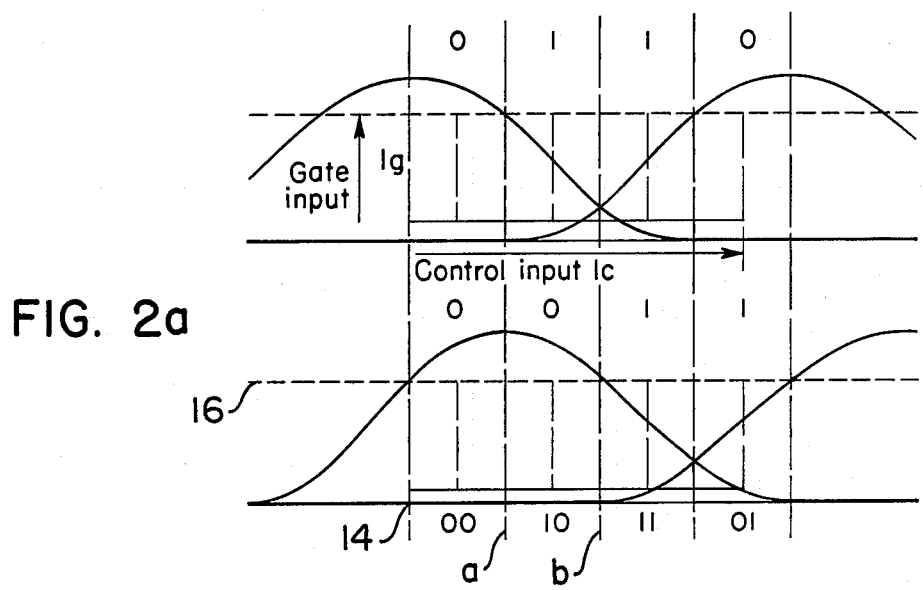
FIG. 2a illustrates the transfer curves for the converter of FIG. 2 over a signal input range.

The transfer curves for the invention are shown in FIG. 2a. The signal to be measured has a full scale range (FSR), which is the range between the maximum positive and negative input of the signal. The analog signal moves between the maximum positive and negative input along the x-axis in FIG. 2a. The gate inputs of interferometers 12a–e are at the baseline 14 when in the superconducting state. When a sampling pulse is received by the interferometers, the interferometers change from the superconducting state to a voltage state. The gate input now jumps to the high level indicated by dashed line 16. The output of each interferometer is either a 1 or a 0, depending on whether the high level 16 is above or below the transfer curve at that point on the x-axis. The specific voltage (or point on the x-axis) of the sampled input signal is identified by the five bits, each of which is either a 1 or 0. For example, in FIG. 1a, analog voltage $V_1$ is represented digitally by the five bit gray code 11000. This gray code is suitable for direct storage or further processing.

The problem with this prior art design arises due to the limitations of interferometers used as comparators. Such interferometers have an unfavorable tradeoff between speed and accuracy. For example, the least significant bit (the output of interferometer 12e) must have $2^{n-1}$ identical periods for an n-bit converter. In FIG. 1a, the number of identical periods for the least significant bit is thirty-two. An interferometer with such a range must have high internal inductance, implying slow speed and threshold shifts due to the input slew rate.

To solve the problem, the use of a sample/hold circuit preceding the converter has been proposed. However, to date, the demonstrated performance of Josephson sample/hold circuits has been inadequate for such a use.

The present invention is shown in FIG. 2, and comprises two interferometers 22a–b for a two-bit converter 20. Instead of using interferometer periodicity, the converter 20 weights the two bits by offsetting.

FIG. 2a shows the transfer functions for the sampling pulse using offsetting. As before, the gate input remains on the baseline 14 as long as the interferometer stays in the superconducting state. When a sampling pulse reaches the interferometer, the gate input reaches the high level 16. Depending on where along the x-axis (the FSR) the sampling pulse is located, a binary gray code is output. As seen in this Figure, the control current offsets for the two interferometers are different, so that the transfer functions are displaced slightly relative to one another in the x-direction.

As with the prior art converter, when a sampling pulse is at a voltage where the gate input high level 16 is greater than the transfer function curve, a 1 is output. If the gate input high level is below the transfer function curve, a 0 is output. Thus, as can be seen in FIG. 2a, a two-bit converter 20 is created which has four different outputs —00, 10, 11 and 01. For example, should the sampled analog signals be within the portion of the full signal range between a and b, the digital output of the converter 20 would be 10.

Figure 3:
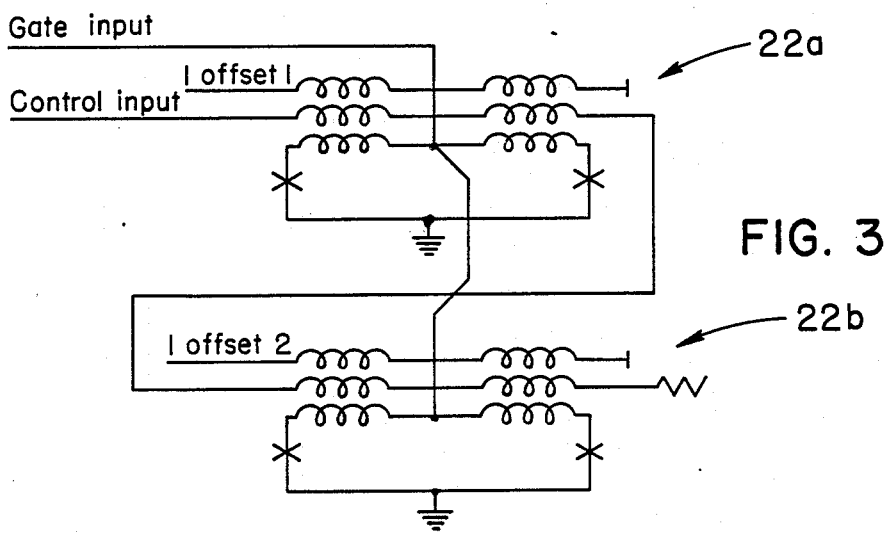
FIG. 3 is a schematic diagram of the interferometers of FIG. 2.

An exemplary embodiment of Josephson junction interferometers usable in the present invention are illustrated in FIG. 3. As discussed earlier, such interferometers themselves are known. However, here the control current offsets are different for the two interferometers.

Figure 4A:
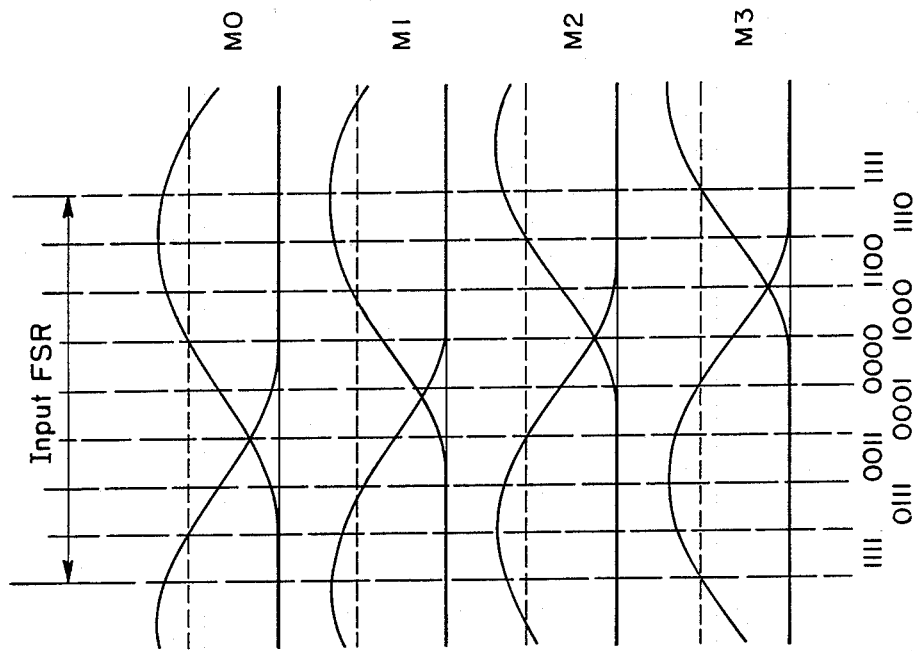
FIG. 4a illustrates the transfer curves for the converter of FIG. 4.
Figure 4:
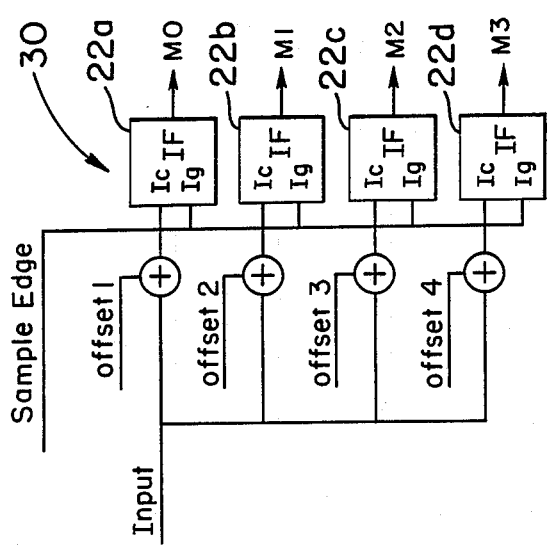
FIG. 4 is a block diagram of a three-bit analog to digital converter constructed in accordance with another embodiment of the present invention.

For illustrative purposes, a three-bit converter 30 is shown in FIG. 4, having $2^{n-1}$ (or 4) interferometers 22a-d. Again, the control current offsets for each of the four interferometers is different. There are then eight different digital outputs for representing the analog signal, as seen in FIG. 4a. Note that the gray code is a "barrel shifted code". In other words, from the digital output 1111 on the extreme left, the next digital output, 0111, has a 0 "shifted" into its most significant bit. A zero is shifted into the most significant bit until 0000 is reached, at which point ones are shifted in. Thus, although there are four bits available, there are only eight different outputs.

Figure 5:
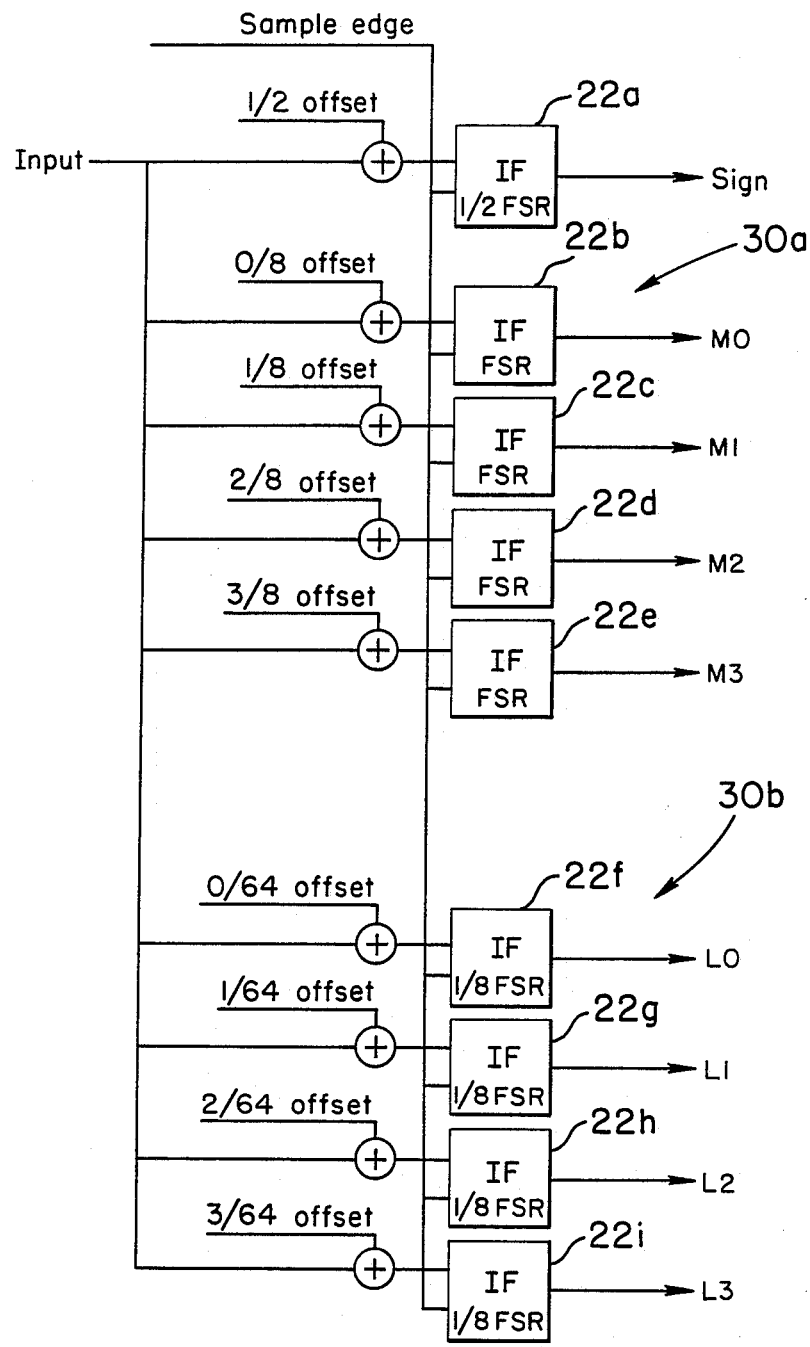
FIG. 5 is a block diagram of a seven-bit converter according to the present invention constructed from the three-bit converters shown in FIG. 4.
Figure 5A:
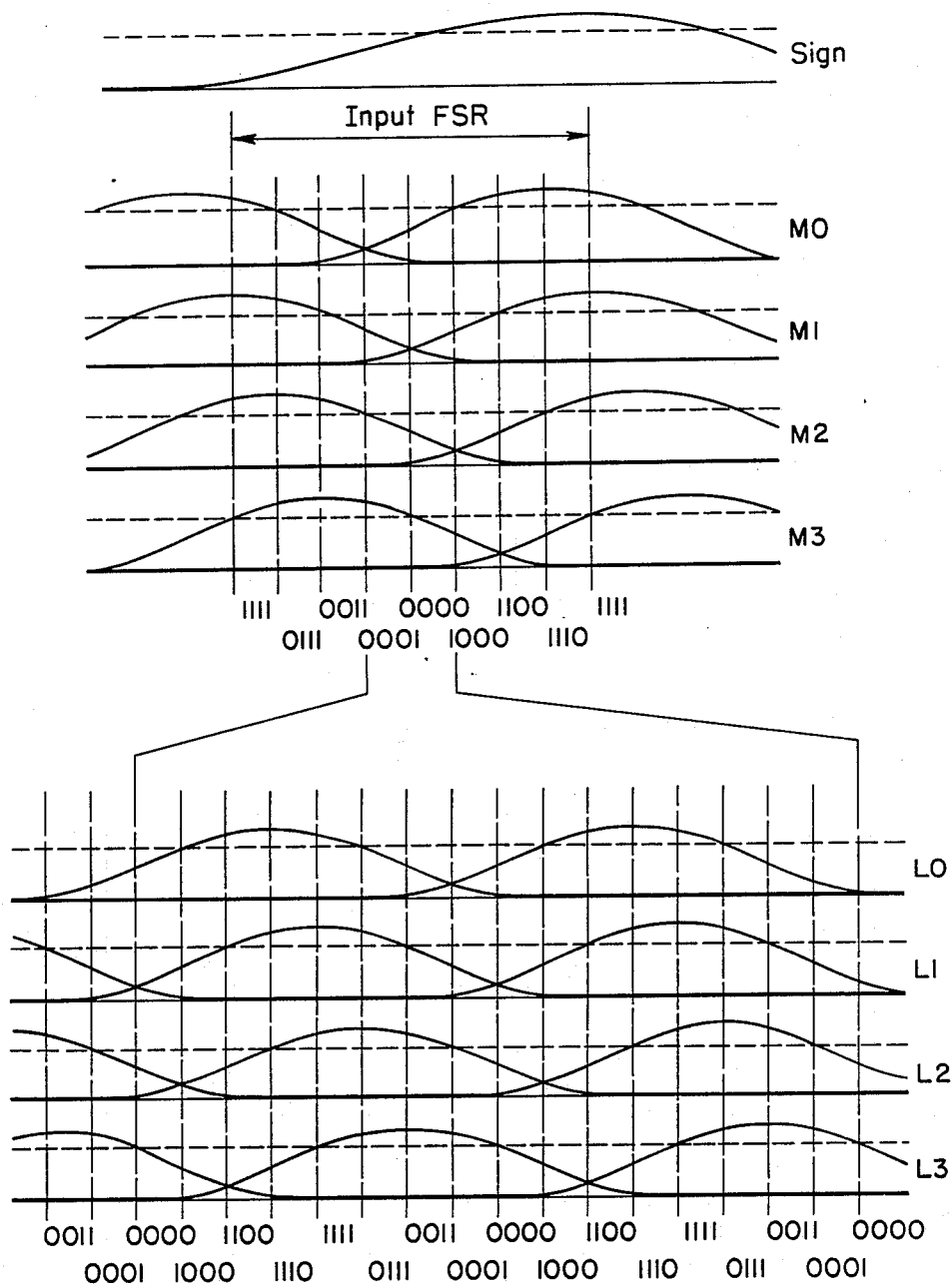
FIG. 5a illustrates the transfer curves for the converter of FIG. 5.

A pure extension of the above implementation shown in FIGS. 2 and 3 would require eight interferometers and eight outputs for a four-bit converter, and sixty-four interferometers and sixty-four outputs for a seven-bit converter. However, in order to reduce complexity, two, three or four-bit converters are combinable to produce larger bit converters. As an example, a seven-bit converter 40 is shown in FIG. 5, which is constructed from two three-bit converters 30 and a single interferometer 22a. The first three-bit converter 30a, containing interferometers 22b-e, converts the input signal into eight different outputs. The second three-bit converter 30b, contains interferometers 22f-i, each of which will convert the sampled input signal after division by eight. Finally, the single interferometer 22a provides a sign bit.

The output of the second three-bit converter 30 is modulo. In other words, there will be eight different outputs in the second three-bit converter 30b for each of the eight different outputs in the first three-bit converter 30a. There are therefore a total of sixty-four different outputs over the 0 to positive FSR of the input signal or 128 total levels with the sign bit.

An advantage of this design of a seven-bit converter 40 over the prior art is that the least significant converter needs to maintain periodicity over plus or minus eight periods; whereas in the prior art, periodicity for a seven-bit converter would be required over plus or minus sixty-four periods. The present invention therefore allows the use of interferometers with lower internal inductance, with their better high-speed properties. This is the result of offsetting to weight the bits rather than using interferometer periodicity. Finally, the illustrated seven-bit converter 40 requires only nine output lines so that there is very minimal overhead in decoding logic or data storage.

What is claimed is:

1. An analog to digital converter, comprising a plurality of interferometers having respective outputs of a bit that forms part of a digital representation of a sampled analog signal; each said interferometer having an offset which is different from any of the offsets of the other interferometers of said plurality of interferometers, whereby said outputs are weighted by said offsetting.

2. The converter of claim 1, wherein said interferometers are Josephson junction interferometers.

3. The converter of claim 2, wherein said offset is a control current offset.

4. An n-bit analog to digital converter, comprising $2^{n-1}$ interferometers having respective outputs of a bit that forms part of a digital representation of a sampled analog signal; each said interferometer having an offset which is different from any of the offsets of the other interferometers of said plurality of interferometers whereby said outputs are weighted by said offsetting.

5. The converter of claim 4, wherein said digital representation is a barrel shifted code.

6. An analog to digital converter, comprising a first set of interferometers which convert a sampled analog signal into n output bits; a second set of interferometers which include means for dividing said sampled analog signal, said second set of interferometers converting said divided analog signal into m output bits, with a combination of said n and m output bits forming a digital representation of said sampled analog signal; wherein each said interferometer has an offset which is different from any of the offsets of the other interferometers whereby said output bits are weighted by said offsetting.

7. The converter of claim 6, wherein n is equal to m.

8. The converter of claim 6, wherein said plurality of interferometers includes an interferometer which provides a sign bit.

9. A method of converting an analog to a digital signal in a converter having a plurality of interferometers comprising the steps of delivering an analog to each of said interferometers, said interferometers producing bits which form a digital representation of said analog signal, and weighting said bits from each said interferometer by providing a control current offset to each said interferometer.

10. The method of claim 9, further comprising the step of dividing said analog signal in a subset of said interferometers, said digital representation of said analog signal being comprised of bits produced by said subset of interferometers which have divided said analog signal, and bits produced by remaining interferometers which have not divided said analog signal.

* * * * *

UNITED STATES PATENT AND TRADEMARK OFFICE
CERTIFICATE OF CORRECTION

PATENT NO. : 4,856,099
DATED : August 8, 1989
INVENTOR(S) : Edwin E. Stebbins

It is certified that error appears in the above-identified patent and that said Letters Patent is hereby corrected as shown below:

Cover page, title, change "ULTRA FAST" to --ULTRAFAST--.

Cover page, title, line 7, change "Aug. 24" to --Aug. 25--.

Column 1, line 2, change "ULTRA FAST" to --ULTRAFAST--.

Column 4, line 51, after "analog" insert --signal--.

Signed and Sealed this

Twenty-first Day of August, 1990

Attest:

HARRY F. MANBECK, JR.

*Attesting Officer*          *Commissioner of Patents and Trademarks*